(12) United States Patent
Nonoyama et al.

(10) Patent No.: US 7,267,783 B2
(45) Date of Patent: Sep. 11, 2007

(54) PIEZOELECTRIC CERAMIC COMPOSITION, ITS PRODUCTION METHOD, AND PIEZOELECTRIC DEVICE AND DIELECTRIC DEVICE

(75) Inventors: Tatsuhiko Nonoyama, Chiryu (JP); Toshiatsu Nagaya, Kuwana (JP); Yasuyoshi Saito, Toyota (JP); Kazumasa Takatori, Nagoya (JP); Takahiko Homma, Owariasahi (JP); Hisaaki Takao, Seto (JP)

(73) Assignee: DENSO CORPORATION, Kariya, Aichi-Pref (JP)

( * ) Notice: Subject to any disclaimer, the term of this patent is extended or adjusted under 35 U.S.C. 154(b) by 176 days.

(21) Appl. No.: 10/391,191

(22) Filed: Mar. 19, 2003

(65) Prior Publication Data

US 2003/0178605 A1    Sep. 25, 2003

(30) Foreign Application Priority Data

Mar. 20, 2002  (JP) .............................. 2002-077590
Feb. 3, 2003   (JP) .............................. 2003-026197

(51) Int. Cl.
*C04B 35/00*     (2006.01)
*C04B 35/495*    (2006.01)
*H01L 41/18*     (2006.01)
*H01L 10/187*    (2006.01)

(52) U.S. Cl. .......................... 252/62.9 R; 252/62.3 R; 257/303; 501/134; 423/594.8

(58) Field of Classification Search .......... 252/62.9 R, 252/62.3 R; 501/134; 257/303
See application file for complete search history.

(56) References Cited

U.S. PATENT DOCUMENTS

| | | | |
|---|---|---|---|
| 2,598,707 A |  | 6/1952 | Matthias |
| 5,951,908 A | * | 9/1999 | Cui et al. ............... 252/62.9 R |
| 6,083,415 A |  | 7/2000 | Kimura et al. |
| 6,093,339 A |  | 7/2000 | Kimura et al. |
| 6,387,295 B1 |  | 5/2002 | Saito |
| 6,458,287 B1 | * | 10/2002 | Nishida et al. ......... 252/62.9 R |
| 6,514,427 B2 | * | 2/2003 | Nishida et al. ......... 252/62.9 R |
| 6,692,652 B2 |  | 2/2004 | Takao et al. |
| 2004/0120881 A1 |  | 6/2004 | Takao et al. |
| 2005/0006618 A1 |  | 1/2005 | Nanao et al. |

FOREIGN PATENT DOCUMENTS

| | | | |
|---|---|---|---|
| JP | 48-81096 | | 10/1973 |
| JP | 49-125900 | | 12/1974 |
| JP | 50-47193 | | 4/1975 |
| JP | 51-55999 | | 5/1976 |
| JP | 55-055589 | | 1/1980 |
| JP | 55-55589 | | 4/1980 |
| JP | 55-055589 | * | 4/1980 |
| JP | 56-120180 | | 9/1981 |
| JP | 56-155579 | * | 12/1981 |
| JP | 58-060582 | * | 4/1983 |
| JP | 58-60582 | | 4/1983 |
| JP | 05082387 A | | 4/1993 |
| JP | 11-228225 | | 8/1999 |
| JP | 11-228226 | | 8/1999 |
| JP | 11-228227 | | 8/1999 |
| JP | 11-228228 | | 8/1999 |
| JP | 2000-313664 | | 11/2000 |
| JP | 2001-240471 | | 9/2001 |
| JP | 2001-316182 | * | 11/2001 |
| JP | 2001-342065 | | 12/2001 |
| JP | 2002-255641 | | 9/2002 |
| JP | 2002-326869 | | 11/2002 |
| JP | 2002-338352 | | 11/2002 |
| JP | 2003-012371 | | 1/2003 |
| JP | 2003-12373 | | 1/2003 |
| JP | 2003-221276 | | 8/2003 |
| SU | 1 294 791 A | | 3/1987 |
| SU | 1294791 | * | 3/1987 |

OTHER PUBLICATIONS

Henson et al, "Dielectric and Electromechanical Properties of (Li,Na)NbO3", J. Am. Cer. Soc. 1977, 60(1-2), pp. 15-17.*
Henson et al, "Dielectric and Electromechanical Properties of (Li, Na)NbO$_3$ Ceramics", Journal of the American Ceramic Society, American Ceramic Society, Columbus, US, vol. 60, No. 1-2, Jan. 1977, pp. 15-17, XP002139696.

* cited by examiner

*Primary Examiner*—Douglas McGinty
*Assistant Examiner*—Kallambella Vijayakumar
(74) *Attorney, Agent, or Firm*—Nixon & Vanderhye P.C.

(57) ABSTRACT

This invention provides a piezoelectric ceramic composition that does not contain lead, can be sintered at a normal pressure and is excellent in at least one of a piezoelectric constant, an electro-mechanical coupling coefficient, a dielectric loss, a relative dielectric constant and a Curie point, its production method, and a piezoelectric device and a dielectric device each utilizing the piezoelectric ceramic composition. The invention relates to a piezoelectric composition expressed by the general formula $\{Li_x(K_{1-y}Na_y)_{1-x}\}(Nb_{1-z}Sb_z)O_3$, each of x, y and z respectively falling within composition ranges of $0 \leq x \leq 0.2$, $0 \leq y \leq 1.0$ and $0 \leq z \leq 0.2$ (with the exception of x=z=0), and its production method. The invention further relates to a piezoelectric device having a piezoelectric body formed of the piezoelectric ceramic composition described above and a dielectric device having a dielectric body formed of the piezoelectric ceramic composition described above.

16 Claims, No Drawings

PIEZOELECTRIC CERAMIC COMPOSITION, ITS PRODUCTION METHOD, AND PIEZOELECTRIC DEVICE AND DIELECTRIC DEVICE

BACKGROUND OF THE INVENTION

1. Field of the Invention

This invention relates to a piezoelectric ceramic composition not containing lead in the composition, its production method, and a piezoelectric device and a dielectric device each using the piezoelectric ceramic composition as its material.

2. Description of the Related Art

A PZT ($PbTiO_3$—$PbZrO_3$) component system ceramic containing lead has been used in the past as a piezoelectric ceramic composition.

The PZT described above is excellent in an electro-mechanical coupling coefficient and piezoelectric characteristics such as a piezoelectric constant, and a piezoelectric device utilizing PZT has been widely used in sensors, actuators, filters, and so forth. Since PZT has a relatively high relative dielectric constant, it has also been used as a dielectric device such as in capacitors.

Though having excellent characteristics, the piezoelectric ceramic composition formed of PZT contains lead as one of its constituent elements. Therefore, detrimental lead is likely to elute from industrial wastes of products containing PZT and to induce environmental pollution. Concerns about the environment in recent years have made it difficult to produce those products that may result in the environmental pollution, such as PZT. Therefore, development of piezoelectric ceramic compositions not containing lead has been required, and a piezoelectric ceramic composition expressed by the general formula $(K_{1-x}Na_x)NbO_3$ (with the proviso that $0<x<1$) has drawn an increasing attention ("Journal of the American Ceramics Society", 1962, Vol. 45, No. 5, p209).

However, because sintering of the piezoelectric ceramic composition expressed by the general formula $(K_{1-x}Na_x)NbO_3$ (with the proviso that $0<x<1$) described above is difficult, hot-press sintering must be conducted and the production cost becomes high. The piezoelectric ceramic composition expressed by this general formula involves the problems that piezoelectric constants such as a piezoelectric $d_{31}$ constant and a piezoelectric $g_{31}$ constant and an electro-mechanical coupling coefficient Kp are low, a dielectric loss is great and a relative dielectric constant is small. Therefore, though the piezoelectric ceramic composition expressed by the general formula $(K_{1-x}Na_x)NbO_3$ ($0<x<1$) is believed to be a novel promising composition that will replace PZT, it has hardly been put into practical application. For this reason, the lead type piezoelectric ceramic composition such as PZT that may invite the environmental pollution has still been utilized widely at present even after the piezoelectric ceramic composition expressed by the general formula described above has been developed.

SUMMARY OF THE INVENTION

In view of the problems described above, this invention aims at providing a piezoelectric ceramic composition that does not contain lead, can be sintered at a normal pressure and is excellent in at least one of a piezoelectric constant, an electro-mechanical coupling coefficient, a dielectric loss, a relative dielectric constant and a Curie point, its production method, and a piezoelectric device and a dielectric device each utilizing the piezoelectric ceramic composition.

According to a first aspect of the invention, there is provided a piezoelectric ceramic composition expressed by the general formula $\{Li_x(K_{1-y}Na_y)_{1-x}\}(Nb_{1-z}Sb_z)O_3$, each of x, y and z falling within composition range of $0 \leq x \leq 0.2$, $0 \leq y \leq 1.0$ and $0 \leq z \leq 0.2$ (with the exception of x=z=0).

The piezoelectric ceramic composition according to the invention is expressed by the general formula $\{Li_x(K_{1-y}Na_y)_{1-x}\}(Nb_{1-z}Sb_z)O_3$ and does not contain lead in the composition.

Therefore, detrimental lead does not elute from wastes of this piezoelectric ceramic composition to the natural world, and the composition is safe.

In the general formula given above, each of x, y and z exists within the respective range described above. Therefore, the piezoelectric ceramic composition is excellent in at least one of a piezoelectric constant, an electro-mechanical coupling coefficient, a dielectric loss, a relative dielectric constant and a Curie point. The piezoelectric ceramic composition described above can be sufficiently densified through sintering at a normal pressure.

The piezoelectric ceramic composition is safe to the environment, can be sintered at a normal temperature and can be used as a material of a piezoelectric device or dielectric device having high performance.

Incidentally, the term "piezoelectric ceramic composition" used in the invention includes not only ceramic compositions having piezoelectric characteristics but also dielectric ceramic compositions having dielectric characteristics.

According to a second aspect of the invention, there is provided a method of producing a piezoelectric ceramic composition comprising the steps of molding powder of a piezoelectric ceramic composition expressed by the general formula $\{Li_x(K_{1-y}Na_y)_{1-x}\}(Nb_{1-z}Sb_z)O_3$, each of x, y and z falling within composition range of $0 \leq x \leq 0.2$, $0 \leq y \leq 1.0$ and $0 \leq z \leq 0.2$ (with the exception of x=z=0); and sintering the resulting molding.

The molding obtained by molding powder formed of the piezoelectric ceramic composition described above can be sintered at a normal temperature. Therefore, sintering can be carried out easily and at a low cost. The piezoelectric ceramic composition obtained after sintering does not contain lead and is excellent in at least one of piezoelectric constants such as a piezoelectric $d_{31}$ constant and a piezoelectric $g_{31}$ constant, an electro-mechanical coupling coefficient, a dielectric loss, a relative dielectric constant and a Curie point. Therefore, the piezoelectric ceramic composition can be utilized as a material of high-performance piezoelectric or dielectric devices.

According to a third aspect of the invention, there is provided a method of producing a piezoelectric ceramic composition comprising the steps of mixing a lithium-containing compound, a sodium-containing compound, a potassium-containing compound, a niobium-containing compound and an antimony-containing compound; and sintering the mixture.

In the invention, the lithium-containing compound, the sodium-containing compound, the potassium-containing compound, the niobium-containing compound and the antimony-containing compound are mixed and sintered as described above.

In consequence, the piezoelectric ceramic composition expressed by the general formula $\{Li_x(K_{1-y}Na_y)_{1-x}\}(Nb_{1-z}Sb_z)O_3$ can be easily obtained.

When sintering is conducted, the piezoelectric ceramic composition described above can be sintered at the normal temperature. The piezoelectric ceramic composition obtained after sintering does not contain lead and is excellent in at least one of the piezoelectric constants such as a piezoelectric $d_{31}$ constant and a piezoelectric $g_{31}$ constant, an electro-mechanical coupling coefficient, a dielectric loss, a relative dielectric constant and a Curie point.

Next, according to a fourth aspect of the invention, there is provided a piezoelectric device having a piezoelectric body formed of the piezoelectric ceramic composition of the first invention described above.

The piezoelectric device described above has a piezoelectric body formed of the piezoelectric ceramic composition of the first invention. Therefore, the piezoelectric device does not contain lead and is safe to the environment. The piezoelectric device can utilize as such the properties of the piezoelectric ceramic composition in that the piezoelectric constant, the electro-mechanical coupling coefficient, etc, are high. Therefore, the piezoelectric device can be utilized as excellent piezoelectric devices such as a piezoelectric sensor having a high sensitivity, a piezoelectric vibrator and an actuator having high electro-mechanical energy conversion efficiency.

According to a fifth aspect of the invention, there is provided a dielectric device having a dielectric body formed of the piezoelectric ceramic composition of the first invention.

The dielectric device described above has the dielectric body formed of the piezoelectric ceramic composition of the first invention. Therefore, the dielectric device does not contain lead and is safe to the environment. The dielectric device can utilize as such the properties of the piezoelectric ceramic composition in that the dielectric loss is low and the relative dielectric constant is high. Consequently, the dielectric device can be utilized as excellent dielectric devices such as a capacitor having a large electrostatic capacity.

According to a sixth aspect of the invention, there is provided a piezoelectric device having a piezoelectric body formed of a piezoelectric ceramic composition produced by the production method of the second or third invention.

The piezoelectric device of the invention uses the piezoelectric ceramic composition produced by the production method of the second or third invention as the piezoelectric body. Therefore, the piezoelectric device can as such utilize the excellent characteristics of the piezoelectric ceramic composition, and can be utilized as excellent piezoelectric devices such as a piezoelectric sensor having a high sensitivity, a piezoelectric vibrator and an actuator having high electro-mechanical energy conversion efficiency.

According to a seventh aspect of the invention, there is provided a dielectric device having a dielectric body formed of a piezoelectric ceramic composition produced by the production method of a piezoelectric ceramic composition according to the second or third invention.

The dielectric device described above uses the piezoelectric ceramic composition produced by the production method of a piezoelectric ceramic composition according to the second or third invention as the dielectric body. Therefore, the dielectric device can utilize as such the excellent properties of the piezoelectric ceramic composition as excellent dielectric devices such as a capacitor having a large electrostatic capacity.

DESCRIPTION OF THE PREFERRED EMBODIMENTS

In the present invention, the piezoelectric ceramic composition described above is expressed by the general formula $\{Li_x(K_{1-y}Na_y)_{1-x}\}(Nb_{1-z}Sb_z)O_3$, and each of x, y and z is within the composition range of $0 \leq x \leq 0.2$, $0 \leq y \leq 0.8$ and $0 \leq z \leq 0.2$ (with the exception of x=z=0), respectively.

Here, when x>0.2, y>1.0 and z>0.2 or when x and z are simultaneously 0 (x=z=0), the piezoelectric constant, the electro-mechanical coupling coefficient and the relative dielectric constant of the piezoelectric ceramic composition drop or the dielectric loss becomes great with the result that a piezoelectric ceramic composition having desired piezoelectric and dielectric characteristics cannot be obtained.

The piezoelectric ceramic composition described above has both piezoelectric and dielectric properties and can be used as both piezoelectric body and dielectric body. More concretely, it can be used as piezoelectric vibrators, surface wave filters, piezoelectric sensors, actuators, ultrasonic motors, piezoelectric transformers and capacitors.

In the first invention described above, the piezoelectric ceramic composition preferably has a piezoelectric $d_{31}$ constant of at least 30 pm/V.

In this case, the piezoelectric ceramic composition can be used in sensors, ultrasonic motors, actuators, piezoelectric transformers, piezoelectric vibrators, etc, having a high sensitivity by making the most of its high piezoelectric $d_{31}$ constant of at least 30 pm/V. To further improve the sensitivity, the piezoelectric $d_{31}$ constant is particularly preferably at least 50 pm/V.

The piezoelectric ceramic composition preferably has a piezoelectric $g_{31}$ constant of at least $7 \times 10^{-3}$ Vm/N.

In this case, the piezoelectric ceramic composition can be used as piezoelectric transformers, ultrasonic motors, sensors, etc, having a high voltage boosting ratio by making the most of its high piezoelectric $g_{31}$ constant of at least $7 \times 10^{-3}$ Vm/N. To obtain products having a higher boosting ratio, the piezoelectric $g_{31}$ constant is particularly preferably at least $10 \times 10^{-3}$ Vm/N.

The piezoelectric ceramic composition described above preferably has an electro-mechanical coupling coefficient Kp of at least 0.3.

In this case, the piezoelectric ceramic composition can be used as piezoelectric actuators, piezoelectric vibrators, sensors, piezoelectric transformers, ultrasonic motors, etc, having high conversion efficiency of mechanical energy and electric energy by making the most of its high electro-mechanical coupling coefficient Kp of at least 0.3. To further improve conversion efficiency of mechanical energy and electric energy, the electro-mechanical coupling coefficient Kp is particularly preferably at least 0.35.

The piezoelectric ceramic composition described above preferably has a dielectric loss of not greater than 0.09.

In this case, the piezoelectric ceramic composition can be used as dielectric devices such as capacitors, piezoelectric transformers, ultrasonic motors, etc, by making the most of its low dielectric constant of not greater than 0.09. Incidentally, the dielectric loss is particularly preferably 0.035 or less.

The piezoelectric ceramic composition described above preferably has a relative dielectric constant of at least 400.

In this case, the piezoelectric ceramic composition can be used as dielectric devices such as capacitors having a great electrostatic capacity by making the most of its relative dielectric constant of at least 400.

The piezoelectric ceramic composition described above preferably has a Curie point of at least 200° C.

In this case, the piezoelectric ceramic composition can be used under a high temperature environment such as in the proximity of an automobile engine by making the most of its high Curie point of at least 200° C. Incidentally, the Curie point is particularly preferably at least 250° C.

The piezoelectric ceramic composition described above preferably has a piezoelectric $d_{31}$ constant of at least 30 pm/V, an electro-mechanical coupling coefficient Kp of at least 0.3 and a Curie point of at least 200° C.

In this case, the piezoelectric ceramic composition can be used under a high temperature environment such as in the proximity of an automobile engine, and can be used as sensors, piezoelectric actuators, piezoelectric transformers, ultrasonic motors, etc, having high sensitivity and high conversion efficiency of mechanical energy and electric energy.

The piezoelectric ceramic composition described above preferably has a piezoelectric $d_{31}$ constant of at least 30 pm/V, a dielectric constant of not greater than 0.09 and a Curie point of at least 200° C.

In this case, the piezoelectric ceramic composition can be used under a high temperature environment such as in the proximity of an automobile engine, and can be used as piezoelectric transformers, ultrasonic motors, etc, having high sensitivity and excellent dielectric loss.

Next, in the third invention described above, it is preferred that the lithium-containing compound is $Li_2CO_3$, the sodium-containing compound is $Na_2CO_3$, the potassium-containing compound is $K_2CO_3$, the niobium-containing compound is $Nb_2O_5$ and the antimony-containing compound is $Sb_2O_5$ or $Sb_2O_3$.

In this case, the piezoelectric ceramic composition described above can be easily produced.

In the fourth or sixth invention, examples of the piezoelectric devices described above include piezoelectric vibrators, surface wave filters, piezoelectric sensors, actuators, ultrasonic motors, piezoelectric transformers, piezoelectric gyro sensors, knock sensors, and so forth.

Next, in the fifth or seventh invention, the dielectric devices described above are for example capacitors and stacked capacitors.

EXAMPLE 1

Piezoelectric ceramic compositions according to examples of the invention will be explained.

In this example, the piezoelectric ceramic composition described above is produced, and its characteristics such as piezoelectric and dielectric characteristics are measured.

The piezoelectric ceramic composition is expressed by the general formula $\{Li_x(K_{1-y}Na_y)_{1-x}\}(Nb_{1-z}Sb_z)O_3$, and each of x, y and z is within the composition range of $0 \leq x \leq 0.2$, $0 \leq y \leq 1.0$ and $0 \leq z \leq 0.2$, respectively (with the exception of x=z=0).

Next, a method for producing the piezoelectric ceramic composition of this example will be explained.

First, high purity $Li_2CO_3$, $K_2CO_3$, $Na_2CO_3$, $Nb_2O_5$ and $Sb_2O_5$ each having a purity of at least 99% are prepared as the starting materials of the piezoelectric ceramic composition. A plurality of materials is prepared by use of these starting materials by changing x and z but keeping y at 0.5 in the general formula $\{Li_x(K_{1-y}Na_y)_{1-x}\}(Nb_{1-z}Sb_z)O_3$. Here, x is set to 0, 0.02, 0.04, 0.06, 0.08, 0.10, 0.12, 0.15 and 0.20. On the other hand, z is set to 0, 0.02, 0.04, 0.06, 0.08, 0.10, 0.12, 0.15 and 0.20. The starting materials so blended as to achieve each stoichiometric composition are mixed in acetone for 24 hours by use of a ball mill to prepare a mixture of each stoichiometric composition.

Next, the mixture is calcined at 750° C. for 5 hours, and the mixture after calcinations is pulverized for 24 hours in the ball mill. Subsequently, polyvinyl butyral as a binder is added and the mixture is granulated.

Powder after granulation is press-molded at a pressure of 2 tons/cm² into a disc having a diameter of 18 mm and a thickness of 1 mm, and the resulting molding is sintered at 1,000 to 1,300° C. for one hour. The sintering temperature at this time is selected between 1,000° C. and 1,300° C. to a temperature that provides a maximum density. Each molding after sintering is compacted to a relative density of at least 98%.

Both surfaces of each molding after sintering are straight-polished and disc polished. Gold electrodes are then provided to both surfaces of each disc sample by sputtering. A DC voltage of 1 to 5 kV/mm is applied across the electrodes, in silicone oil, at 100° C. for 10 minutes, and polarization is attained in the direction of thickness to give each piezoelectric ceramic composition of this example.

The piezoelectric $d_{31}$ constant, the piezoelectric $g_{31}$ constant, the electro-mechanical coupling coefficient Kp, the Curie point, the dielectric loss and the relative dielectric constant are measured for each of the piezoelectric ceramic compositions so produced in this example. Here, the piezoelectric $d_{31}$ constant, the piezoelectric $g_{31}$ constant and the electro-mechanical coupling coefficient Kp are measured in accordance with a resonance-antiresonance method by use of an impedance analyzer. The dielectric loss and the relative dielectric constant are measured at a measurement frequency of 1 kHz by use of the impedance analyzer. The Curie point is set to the temperature that provides the highest relative dielectric constant.

The results are shown in Tables 1 to 6.

TABLE 1

| | | \multicolumn{9}{c}{piezoelectric $d_{31}$ constant (pm/V)} | | | | | | | | | |
|---|---|---|---|---|---|---|---|---|---|---|
| x | 0.20 | 9.7 | 24.5 | 9.1 | 24.3 | 33.9 | 44.5 | | | |
| | 0.15 | 10.1 | 26.2 | 51.0 | 46.4 | 44.2 | 34.7 | | | |
| | 0.12 | | | | | 55.8 | 58.2 | 66.4 | | |
| | 0.10 | 20.4 | 51.1 | 63.9 | 65.4 | 91.6 | 84.5 | 73.4 | 26.9 | 22.7 |
| | 0.08 | 27.5 | 62.8 | 72.7 | 78.1 | 75.1 | 82.2 | 50.8 | 82.0 | |
| | 0.06 | 57.7 | 59.2 | 102.9 | 87.6 | 77.8 | 80.1 | 41.3 | | |
| | 0.04 | 39.8 | 55.2 | 60.3 | 74.0 | 66.9 | 59.9 | | 61.5 | |
| | 0.02 | 46.9 | 51.5 | 56.3 | 65.5 | 74.8 | 66.2 | | | |
| | 0 | (37.6) | 45.1 | 63.0 | 58.3 | 54.8 | 60.9 | | 37.7 | 28.2 |
| | | 0 | 0.02 | 0.04 | 0.06 | 0.08 | 0.10 | 0.12 | 0.15 | 0.20 |
| | | \multicolumn{9}{c}{z} | | | | | | | | | |

Parenthesis ( ) represents a value of a comparative product.

TABLE 2 electro-mechanical coupling coefficient Kp

| x | | | | | | | | | |
|---|---|---|---|---|---|---|---|---|---|
| 0.20 | 0.092 | 0.148 | 0.033 | 0.162 | 0.240 | 0.285 | | | |
| 0.15 | 0.087 | 0.189 | 0.348 | 0.309 | 0.279 | 0.203 | | | |
| 0.12 | | | | | 0.340 | 0.357 | 0.361 | | |
| 0.10 | 0.151 | 0.357 | 0.402 | 0.390 | 0.459 | 0.433 | 0.378 | 0.120 | 0.150 |
| 0.08 | 0.196 | 0.400 | 0.425 | 0.421 | 0.419 | 0.403 | 0.236 | 0.415 | |
| 0.06 | 0.332 | 0.441 | 0.506 | 0.448 | 0.420 | 0.409 | 0.236 | | |
| 0.04 | 0.371 | 0.489 | 0.463 | 0.468 | 0.422 | 0.321 | | 0.351 | |
| 0.02 | 0.469 | 0.435 | 0.480 | 0.473 | 0.473 | 0.334 | | | |
| 0 | (0.334) | 0.418 | 0.466 | 0.386 | 0.328 | 0.260 | | 0.233 | 0.134 |
| | 0 | 0.02 | 0.04 | 0.06 | 0.08 | 0.10 | 0.12 | 0.15 | 0.20 |
| | | | | | z | | | | |

Parenthesis ( ) represents a value of a comparative product.

TABLE 3 piezoelectric $g_{31}$ constant (mVm/N)

| x | | | | | | | | | |
|---|---|---|---|---|---|---|---|---|---|
| 0.20 | 2.8 | 3.0 | 0.7 | 3.4 | 4.8 | 5.6 | | | |
| 0.15 | 1.4 | 4.4 | 7.3 | 6.1 | 6.0 | 4.1 | | | |
| 0.12 | | | | | 6.1 | 6.4 | 5.9 | | |
| 0.10 | 3.5 | 7.7 | 7.8 | 7.2 | 7.9 | 7.2 | 6.0 | 1.5 | 3.1 |
| 0.08 | 4.7 | 8.0 | 8.3 | 7.4 | 7.3 | 6.4 | 4.6 | | |
| 0.06 | 7.5 | 5.4 | 8.6 | 7.4 | 7.4 | 7.0 | 4.1 | | |
| 0.04 | 11.0 | 14.0 | 13.0 | 9.6 | 8.8 | 5.8 | | | |
| 0.02 | 14.5 | 10.2 | 12.5 | 10.7 | 9.3 | 5.2 | | | |
| 0 | (9.9) | 12.2 | 10.4 | 7.8 | 6.8 | 3.6 | | 4.2 | 2.0 |
| | 0 | 0.02 | 0.04 | 0.06 | 0.08 | 0.10 | 0.12 | 0.15 | 0.20 |
| | | | | | z | | | | |

Parenthesis ( ) represents a value of a comparative product.

TABLE 4

Curie point (° C.)

| x | | | | | | | | |
|---|---|---|---|---|---|---|---|---|
| 0.20 | 505 | 483 | 462 | 440 | 421 | 400 | | |
| 0.15 | 502 | 469 | 440 | 403 | 375 | 345 | | |
| 0.10 | 499 | 471 | 443 | 400 | 355 | 277 | 276 | 275 |
| 0.08 | 485 | 448 | 414 | 373 | 333 | 258 | | |
| 0.06 | 474 | 425 | 385 | 346 | 312 | 238 | | |
| 0.04 | 460 | 406 | 365 | 328 | 288 | 215 | | |
| 0.02 | 435 | 388 | 344 | 311 | 280 | 205 | | |
| 0 | (415) | 370 | 326 | 294 | 259 | 193 | 177 | 160 |
| | 0 | 0.02 | 0.04 | 0.06 | 0.08 | 0.10 | 0.15 | 0.20 |
| | | | | | z | | | |

Parenthesis ( ) represents a value of a comparative product.

TABLE 5 relative dielectric constant

| x | | | | | | | | | |
|---|---|---|---|---|---|---|---|---|---|
| 0.20 | 399 | 925 | 739 | 817 | 792 | 902 | | | |
| 0.15 | 530 | 675 | 786 | 864 | 830 | 950 | | | |
| 0.12 | | | | | | 1101 | 1272 | | |
| 0.10 | 657 | 750 | 920 | 1033 | 1314 | 1320 | 1382 | 2023 | 829 |
| 0.08 | 657 | 887 | 986 | 1193 | 1166 | 1458 | 1237 | 1280 | |
| 0.06 | 864 | 904 | 1359 | 1339 | 1189 | 1298 | 1129 | | |
| 0.04 | 409 | 446 | 522 | 868 | 858 | 1159 | | 1342 | |
| 0.02 | 364 | 408 | 510 | 692 | 907 | 1427 | | | |
| 0 | (429) | 416 | 687 | 847 | 913 | 1898 | | 1020 | 1595 |
| | 0 | 0.02 | 0.04 | 0.06 | 0.08 | 0.10 | 0.12 | 0.15 | 0.20 |
| | | | | | z | | | | |

Parenthesis ( ) represents a value of a comparative product.

TABLE 6 dielectric loss

| x \ z | 0 | 0.02 | 0.04 | 0.06 | 0.08 | 0.10 | 0.12 | 0.15 | 0.20 |
|---|---|---|---|---|---|---|---|---|---|
| 0.20 | 0.091 | 0.299 | 0.118 | 0.211 | 0.180 | 0.030 | | | |
| 0.15 | 0.045 | 0.173 | 0.023 | 0.071 | 0.105 | 0.082 | | | |
| 0.12 | | | | | 0.018 | 0.020 | 0.025 | | |
| 0.10 | 0.088 | 0.021 | 0.024 | 0.015 | 0.023 | 0.018 | 0.031 | 0.048 | 0.034 |
| 0.08 | 0.037 | 0.013 | 0.016 | 0.016 | 0.022 | 0.027 | 0.034 | | |
| 0.06 | 0.050 | 0.026 | 0.020 | 0.029 | 0.027 | 0.029 | 0.035 | | |
| 0.04 | 0.014 | 0.018 | 0.029 | 0.026 | 0.024 | 0.036 | | | |
| 0.02 | 0.003 | 0.025 | 0.035 | 0.028 | 0.030 | 0.040 | | | |
| 0 | (0.036) | 0.051 | 0.107 | 0.053 | 0.037 | 0.046 | | 0.035 | 0.038 |

Parenthesis ( ) represents a value of a comparative product.

To clarify the excellent characteristics of the piezoelectric ceramic composition of the invention, this example produces the comparative products in the following way.

First, high purity $K_2CO_3$, $Na_2CO_3$ and $Nb_2O_5$ each having a purity of at least 99% are prepared as the starting materials of the comparative products. The starting materials are blended into the stoichiometric composition of $(K_{1-x}Na_x)NbO_3$ (with x=0.5), and the composition is mixed in acetone for 24 hours by use of a ball mill to prepare a mixture.

Next, this mixture is calcined at 750° C. for 5 hours, and the mixture after calcination is pulverized for 24 hours in the ball mill. Subsequently, polyvinyl butyral is added as a binder, and the mixture is granulated.

Powder after granulation is press-molded at a pressure of 2 tons/cm² into a disc having a diameter of 18 mm and a thickness of 1 mm, and the resulting molding is sintered at 1,100° C. for one hour. Incidentally, a relative density after sintering is 96.2%.

Both surfaces of each molding after sintering are straight-polished and disc-polished. Gold electrodes are then provided to both surfaces of each disc sample by sputtering. A DC voltage of 1 to 5 kV/mm is applied across the electrodes for 10 minutes, in silicone oil, at 100° C., and polarization is attained in the direction of thickness to give each comparative product.

The piezoelectric $d_{31}$ constant, the piezoelectric $g_{31}$ constant, the electro-mechanical coupling coefficient Kp, the Curie point, the dielectric loss and the relative dielectric constant are measured for each of the comparative product so produced. The measurement method of each measurement value is the same as that of the products of the invention.

The results are shown in Tables 1 to 6. In the matrix shown in each table, the column of x=0 and z=0 represents the measurement result of the comparative products.

It can be seen from Table 1 that in the composition range of $0 \leq x \leq 0.10$, y=0.5 and $0 \leq z \leq 0.10$ in the general formula $\{Li_x(K_{1-y}Na_y)_{1-x}\}(Nb_{1-z}Sb_z)O_3$, the piezoelectric $d_{31}$ constant of almost all the piezoelectric ceramic compositions of this example is higher than the piezoelectric $d_{31}$ constant of the comparative products. The piezoelectric $d_{31}$ constant scores the highest value of 102.9 pm/V at x=0.06, y=0.5 and z=0.04.

When a charge detection type circuit or a current detection type circuit is used, the piezoelectric $d_{31}$ constant is generally proportional to an output voltage of a piezoelectric type sensor such as acceleration sensors, pressure application sensors, impact sensors and knock sensors. From this aspect, a piezoelectric ceramic composition having a higher piezoelectric $d_{31}$ constant can fabricate a sensor having a greater charge sensor output. To produce sensors having characteristics at least equivalent to those of the comparative products, the composition preferably has a piezoelectric $d_{31}$ constant of at least 30 pm/V. To produce a high sensitivity sensor by improving a signal-to-noise ratio (SN ratio) and an output voltage, the piezoelectric $d_{31}$ constant is preferably at least 50 pm/V.

Next, it can be seen from Table 2 that, in the composition range of $0 \leq x \leq 0.10$, y=0.5 and $0 \leq z \leq 0.10$ in the general formula $\{Li_x(K_{1-y}Na_y)_{1-x}\}(Nb_{1-z}Sb_z)O_3$, the electro-mechanical coupling coefficients Kp of almost all the piezoelectric ceramic compositions of this example are higher than the electro-mechanical coupling coefficient Kp of the comparative products. The electro-mechanical coupling coefficient Kp scores the highest value of 0.506 at x=0.06, y=0.5 and z=0.04.

The electro-mechanical coupling coefficient Kp is generally proportional to electro-mechanical energy conversion efficiency of piezoelectric transformers, ultrasonic motors, actuators or ultrasonic vibrators. From this aspect, a piezoelectric ceramic composition having a higher electro-mechanical coupling coefficient Kp can fabricate piezoelectric transformers, ultrasonic motors, actuators or ultrasonic vibrators having higher electro-mechanical energy conversion efficiency. To produce piezoelectric transformers, ultrasonic motors, actuators or ultrasonic vibrators having characteristics at least equivalent to those of the comparative products, the composition preferably has an electro-mechanical coupling coefficient Kp of at least 0.3, more preferably at least 0.35.

Next, it can be seen from Table 3 that, in the composition range of $0 \leq x \leq 0.04$, y=0.5 and $0 \leq z \leq 0.06$ in the general formula $\{Li_x(K_{1-y}Na_y)_{1-x}\}(Nb_{1-z}Sb_z)O_3$, the piezoelectric $g_{31}$ constants of almost all the piezoelectric ceramic compositions of this example are higher than the piezoelectric $g_{31}$ constants of the comparative products. The piezoelectric $g_{31}$ constants scores the highest value of $14.5 \times 10^{-3}$ Vm/N at x=0.02, y=0.5 and z=0.

The piezoelectric $g_{31}$ constant is generally proportional to an output voltage of piezoelectric sensors, piezoelectric transformers and ultrasonic motors in the same way as the piezoelectric $d_{31}$ constant. From this aspect, a piezoelectric ceramic composition having a higher piezoelectric $g_{31}$ constant can fabricate a sensor having a greater charge sensor output. To produce sensors having characteristics at least equivalent to those of the comparative products, the composition preferably has a piezoelectric $g_{31}$ constant of at least $10 \times 10^{-3}$ Vm/N.

Next, it can be seen from Table 4 that in the composition range of $0 \leq x \leq 0.20$, y=0.5 and $0 \leq z \leq 0.10$ in the general formula $\{Li_x(K_{1-y}Na_y)_{1-x}\}(Nb_{1-z}Sb_z)O_3$, the Curie points of the piezoelectric ceramic compositions of this example is higher than 193° C. Therefore, the piezoelectric ceramic composition of this example falling within the composition range described above can be used for high-temperature sensor components, high-temperature actuator components and high-temperature ultrasonic motor components such as knock sensors that can be stably used for a long time at high-temperature portions in the proximity of automobile engines.

To stably use the composition as the high-temperature sensor components, the high-temperature actuator components and the high-temperature ultrasonic motor components for a longer time, the Curie point described above is preferably higher than 200° C. and further preferably higher than 250° C.

Next, it can be seen from Table 5 that in the composition range of $0 \leq x \leq 0.20$, $y=0.5$ and $0 \leq z \leq 0.20$ in the general formula $\{Li_x(K_{1-y}Na_y)_{1-x}\}(Nb_{1-z}Sb_z)O_3$, the relative dielectric constants of almost all the piezoelectric ceramic compositions of this example are higher than the relative dielectric constants of the comparative products. The relative dielectric constants scores the highest value of 2,023 at $x=0.10$, $y=0.5$ and $z=0.15$.

The relative dielectric constant is generally proportional to the electrostatic capacity of capacitors. From this aspect, a piezoelectric ceramic composition having a higher relative dielectric constant can fabricate a capacitor having a greater electrostatic capacity. To produce capacitors having characteristics at least equivalent to those of the comparative products, the composition preferably has a relative dielectric constant of 400 or more, further preferably 600 or more.

Next, it can be seen from Table 6 that in the composition range of $0 \leq x \leq 0.20$, $y=0.5$ and $0 \leq z \leq 0.20$ in the general formula $\{Li_x(K_{1-y}Na_y)_{1-x}\}(Nb_{1-z}Sb_z)O_3$, the dielectric loss of almost all the piezoelectric ceramic compositions of this example is greater than the dielectric loss of the comparative products. The dielectric loss scores the highest value of 0.003 at $x=0.02$, $y=0.5$ and $z=0$.

The dielectric loss is proportional to the heat energy that a capacitor loses when an AC voltage is applied to the capacitor such as a laminated capacitor. From this aspect, a piezoelectric ceramic composition having a smaller dielectric loss can fabricate a capacitor having a smaller energy loss. To produce capacitors having characteristics at least equivalent to those of the comparative products, the composition preferably has a dielectric loss of not greater than 0.09, further preferably not greater than 0.035.

EXAMPLE 2

In this example, piezoelectric ceramic compositions are prepared by changing the K and Na contents contained in the piezoelectric ceramic compositions expressed by the general formula $\{Li_x(K_{1-y}Na_y)_{1-x}\}(Nb_{1-z}Sb_z)O_3$ described above, and the piezoelectric and dielectric characteristics are examined.

More concretely, the piezoelectric ceramic compositions in which y is 0.60, 0.50 and 0.40 are prepared while x and z are kept fixed at $x=0.06$ and $z=0.04$, respectively, in the general formula $\{Li_x(K_{1-y}Na_y)_{1-x}\}(Nb_{1-z}Sb_z)O_3$. Therefore, the Na content in this instance is 0.564 mol, 0.47 mol and 0.37.6 mol per mol of the compounds expressed by the general formula given above.

Next, the production method of the piezoelectric ceramic compositions described above will be explained.

First, high purity $Li_2CO_3$, $K_2CO_3$, $Na_2CO_3$, $Nb_2O_5$ and $Sb_2O_5$ each having a purity of at least 99% are prepared as the starting materials in the same way as in Example 1. The starting materials are blended in such a fashion as to attain $x=0.06$, $z=0.04$ and $y=0.60$, 0.50 and 0.40, respectively, in the general formula $\{Li_x(K_{1-y}Na_y)_{1-x}\}(Nb_{1-z}Sb_z)O_3$ to prepare three kinds of materials. These three kinds of materials are respectively mixed in acetone for 24 hours by use of a ball mill in the same way as in Example 1 and each mixture of the stoichiometric composition is prepared.

Each mixture is calcined and pulverized. After a binder is added, the mixture is granulated in the same way as in Example 1.

Powder after granulation is press-molded at a pressure of 2 tons/cm$^2$ into a disc having a diameter of 18 mm and a thickness of 1 mm, and the resulting molding is sintered at 1,000 to 1,300° C. for one hour in the same way as in Example 1. Incidentally, a temperature providing a maximum density is selected as the sintering temperature between 1,000 and 1,300° C. All the moldings after sintering are compacted to a relative density 98% or more.

Both surfaces of each molding after sintering are straight-polished and disc-polished. Gold electrodes are then provided to both surfaces of each disc sample by sputtering. A DC voltage of 1 to 5 kV/mm is applied across the electrodes for 10 minutes, in silicone oil, at 100° C., and polarization is attained in the direction of thickness to give three kinds of piezoelectric ceramic compositions. These compositions are called Sample E1 to Sample E3, respectively.

The piezoelectric ceramic composition of Sample E1 is expressed by $Li_{0.06}(K_{0.4}Na_{0.6})_{0.94}(Nb_{0.96}Sb_{0.04})O_3$. The piezoelectric ceramic composition of Sample E2 is expressed by $Li_{0.06}(K_{0.5}Na_{0.5})_{0.94}(Nb_{0.96}Sb_{0.04})O_3$. The piezoelectric ceramic composition of Sample E3 is expressed by $Li_{0.06}(K_{0.6}Na_{0.4})_{0.94}(Nb_{0.96}Sb_{0.04})O_3$.

The piezoelectric $d_{31}$ constant, the piezoelectric $g_{31}$ constant, the electro-mechanical coupling coefficient Kp, the dielectric loss and the relative dielectric constant are measured for these three kinds of piezoelectric ceramic compositions (Samples E1 to E3). Among them, the piezoelectric $d_{31}$ constant, the piezoelectric $g_{31}$ constant and the electro-mechanical coupling coefficient Kp are measured in accordance with a resonance-antiresonance method using an impedance analyzer. The dielectric loss and the relative dielectric constant are measured at a measuring frequency of 1 kHz by use of the impedance analyzer.

The result is tabulated in Table 7.

TABLE 7

| sample No. | Sample E1 | Sample E2 | Sample E3 |
|---|---|---|---|
| x | 0.06 | 0.06 | 0.06 |
| y | 0.60 | 0.50 | 0.40 |
| z | 0.04 | 0.04 | 0.04 |
| piezoelectric $d_{31}$ constant (pm/V) | 42.3 | 102.9 | 25.8 |
| electro-mechanical coupling coefficient Kp | 0.248 | 0.506 | 0.176 |
| piezoelectric $g_{31}$ constant (mVm/N) | 4.3 | 8.6 | 3.3 |
| relative dielectric constant | 1105 | 1359 | 876 |
| dielectric loss | 0.035 | 0.020 | 0.038 |

As can be seen from Table 7, these three kinds of piezoelectric ceramic compositions of this example exhibit excellent piezoelectric and dielectric characteristics and have particularly excellent relative dielectric constants.

It can be understood from this example that when the piezoelectric ceramic composition is produced by changing the y value in the general formula $\{Li_x(K_{1-y}Na_y)_{1-x}\}(Nb_{1-z}Sb_z)O_3$, piezoelectric ceramic compositions excellent in both piezoelectric and dielectric characteristics can be obtained.

What is claimed is:

1. A piezoelectric ceramic composition consisting of the general formula $$\{Li_x(K_{1-y}Na_y)_{1-x}\}(Nb_{1-z}Sb_z)O_3,$$

wherein each of x, y and z respectively fall within composition ranges of $0<x\leq0.2$, $0<y<1.0$ and $0<z\leq0.2$ (with the exception of x=z=0).

2. A piezoelectric ceramic composition as defined in claim 1, wherein a piezoelectric $d_{31}$ constant of said piezoelectric ceramic composition is 30 pm/V or above.

3. A piezoelectric ceramic composition as defined in claim 1, wherein a piezoelectric $g_{31}$ constant of said piezoelectric ceramic composition is $7\times10^{-3}$ Vm/N or above.

4. A piezoelectric ceramic composition as defined in claim 1, wherein an electro-mechanical coupling coefficient Kp of said piezoelectric ceramic composition is 0.3 or above.

5. A piezoelectric ceramic composition as defined in claim 1, wherein a dielectric loss of said piezoelectric ceramic composition is 0.09 or below.

6. A piezoelectric ceramic composition as defined in claim 1, wherein a relative dielectric constant of said piezoelectric ceramic composition is 400 or above.

7. A piezoelectric ceramic composition as defined in claim 1, wherein a Curie point of said piezoelectric ceramic composition is 200° C. or above.

8. A piezoelectric ceramic composition as defined in claim 1, wherein said dielectric ceramic composition has a piezoelectric $d_{31}$ constant of 30 pm/V or above, an electro-mechanical coupling coefficient Kp of 0.3 or above and a Curie point of 200° C. or above.

9. A piezoelectric ceramic composition as defined in claim 1, wherein said dielectric ceramic composition has a piezoelectric $d_{31}$ constant of 30 pm/V or above, a dielectric loss of 0.09 or below and a Curie point of 200° C. or above.

10. A method of producing a piezoelectric ceramic composition comprising the steps of:
(a) molding a powder of a piezoelectric composition consisting of the general formula $$\{Li_x(K_{1-y}Na_y)_{1-x}\}(Nb_{1-z}Sb_z)O_3,$$

wherein each of x, y and z respectively fall within the composition range of $0<x\leq0.2$, $0<y<1.0$ and $0<z\leq0.2$ (with the exception of x=z=0); and
(b) sintering the resulting molding.

11. A method of producing a piezoelectric ceramic composition for obtaining said piezoelectric ceramic composition as defined in claim 1, comprising the steps of:
(a) mixing a lithium-containing compound, a sodium-containing compound, a potassium-containing compound, a niobium-containing compound and an antimony-containing compound; and
(b) sintering the mixture.

12. A method of producing a piezoelectric ceramic composition as defined in claim 11, wherein said lithium-containing compound is $Li_2CO_3$, said sodium-containing compound is $Na_2CO_3$, said potassium-containing compound is $K_2CO_3$, said niobium-containing compound is $Nb_2O_5$, and said antimony-containing compound is $Sb_2O_5$ or $Sb_2O_3$.

13. A piezoelectric device having a piezoelectric body formed of said piezoelectric ceramic composition as defined in claim 1.

14. A dielectric device having a dielectric body formed of said piezoelectric ceramic composition as defined in claim 1.

15. A piezoelectric device having a piezoelectric body formed of a piezoelectric ceramic composition produced by the method of claim 10.

16. A dielectric device having a dielectric body formed of a dielectric ceramic composition produced by the method of a claim 10.

* * * * *